(12) United States Patent
Chen et al.

(10) Patent No.: US 6,842,468 B2
(45) Date of Patent: Jan. 11, 2005

(54) APPARATUS AND METHOD FOR MONITORING AND CONTROLLING TUNABLE FILTERS AND TUNABLE VCSELS

(75) Inventors: Hong Chen, Shrewsbury, MA (US); Ravi Krishnan Rajan, Wakefield, MA (US); Peidong Wang, Carlisle, MA (US)

(73) Assignee: Nortel Networks, Ltd., St. Laurent (CA)

( * ) Notice: Subject to any disclaimer, the term of this patent is extended or adjusted under 35 U.S.C. 154(b) by 0 days.

(21) Appl. No.: 10/386,869

(22) Filed: Mar. 12, 2003

(65) Prior Publication Data

US 2004/0004981 A1 Jan. 8, 2004

Related U.S. Application Data

(60) Provisional application No. 60/364,241, filed on Mar. 13, 2002.

(51) Int. Cl.[7] ................................................ H01S 3/13
(52) U.S. Cl. ........................................................ 372/32
(58) Field of Search ..................... 372/20, 32; 250/201.1

(56) References Cited

U.S. PATENT DOCUMENTS 4,508,964 A * 4/1985 Gunning et al. .......... 250/201.1
6,498,800 B1 * 12/2002 Watterson et al. ............ 372/20

* cited by examiner

*Primary Examiner*—Quyen Leung
(74) *Attorney, Agent, or Firm*—John C. Gorecki, Esq.

(57) ABSTRACT

Apparatus for use in tuning a tunable optical device to a target wavelength, the apparatus comprising: a light source for generating light at a wavelength which is a higher order mode of the operational wavelength of the tunable device; and a wavelength detector and control unit for monitoring the wavelength of light emerging from the tunable device and controlling the tuning voltage applied to the tunable device according to the wavelength of the light emerging from the tunable device.

18 Claims, 6 Drawing Sheets

APPARATUS AND METHOD FOR MONITORING AND CONTROLLING TUNABLE FILTERS AND TUNABLE VCSELS

REFERENCE TO RELATED APPLICATION

This patent application claims benefit of prior U.S. Provisional Patent Application Ser. No. 60/364,241, filed Mar. 13, 2002 for METHODS TO MONITOR AND CONTROL CAVITY RESONANCES OF TUNABLE FABRY-PEROT DEVICES, which patent application is hereby incorporated herein by reference.

FIELD OF THE INVENTION

This invention relates to photonic devices in general, and more particularly to tunable filters and tunable lasers.

BACKGROUND OF THE INVENTION

Tunable Fabry-Perot filters and tunable vertical cavity surface emitting lasers (VCSEL's) have recently generated considerable interest in the art. Among other things, these devices are believed to have application for a wide range of different optical components and systems, e.g., wavelength division multiplexing (WDM) fiberoptic systems, switches, routers, etc.

In some tunable Fabry-Perot filters and in some tunable VCSEL's, tuning is achieved by using an electrostatic field to move a top mirror relative to a bottom mirror, whereby to change the length of the Fabry-Perot cavity and hence tune the wavelength of the device.

While such a construction is advantageous in that it provides a fast and easy way to tune the device, in practice it has proven difficult to produce relatively uniform devices. Significant performance variations typically occur from device-to-device and from batch-to-batch. In addition, significant performance variations can also occur with a specific device over time, as the device ages, changes temperature, etc.

SUMMARY OF THE INVENTION

As a result, one object of the present invention is to provide a novel apparatus for use in tuning a tunable Fabry-Perot filter and/or a tunable VCSEL to a precise, known wavelength.

Another object of the present invention is to provide a novel method for tuning a tunable Fabry-Perot filter and/or a tunable VCSEL to a precise, known wavelength.

These and other objects are addressed by the present invention.

In one form of the invention, there is provided apparatus for use in tuning a tunable optical device to a target wavelength, the apparatus comprising apparatus for monitoring and controlling the operational wavelength of a tunable device comprising a Fabry-Perot cavity, the apparatus comprising: a light source for generating light at a wavelength which is a higher order mode of the operational wavelength of the tunable device; and a wavelength detector and control unit for monitoring the wavelength of light emerging from the tunable device and controlling the tuning voltage applied to the tunable device according to the wavelength of the light emerging from the tunable device.

In another form of the invention, there is provided apparatus for providing light of a selected wavelength, the apparatus comprising a tunable device comprising a tunable Fabry-Perot cavity; and apparatus for monitoring and controlling the operational wavelength of the tunable device, the apparatus comprising: a light source for generating light at a wavelength which is a higher order mode of the operational wavelength of the tunable device; and a wavelength detector and control unit for monitoring the wavelength of light emerging from the tunable device and controlling the tuning voltage applied to the tunable device according to the wavelength of the light emerging from the tunable device.

And in another form of the invention, there is provided a method for monitoring and controlling the operational wavelength of a tunable device comprising a Fabry-Perot cavity, the method comprising: generating light at a wavelength which is a higher order mode of the operational wavelength of the tunable device; and monitoring the wavelength of light emerging from the tunable device and controlling the tuning voltage applied to the tunable device according to the wavelength of the light emerging from the tunable device.

BRIEF DESCRIPTION OF THE DRAWINGS

These and other objects and features of the present invention will be more fully disclosed by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

In pending prior U.S. patent application Ser. No. 10/136,057, filed Apr. 29, 2002 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 5, 2000 by Peidong Wang et al. for SINGLE MODE OPERATION OF MICROELECTROMECHANICALLY TUNABLE, HALF-SYMMETRIC, VERTICAL CAVITY SURFACE EMITTING LASERS, and in pending prior U.S. patent application Ser. No. 09/750,434, filed Dec. 28, 2000 by Peidong Wang et al. for TUNABLE FABRY-PEROT FILTER AND TUNABLE VERTICAL CAVITY SURFACE EMITTING LASER, there are disclosed tunable Fabry-Perot filters and tunable vertical cavity surface emitting lasers (VCSEL's). The three aforementioned patent applications are hereby incorporated herein by reference.

Figure 1:
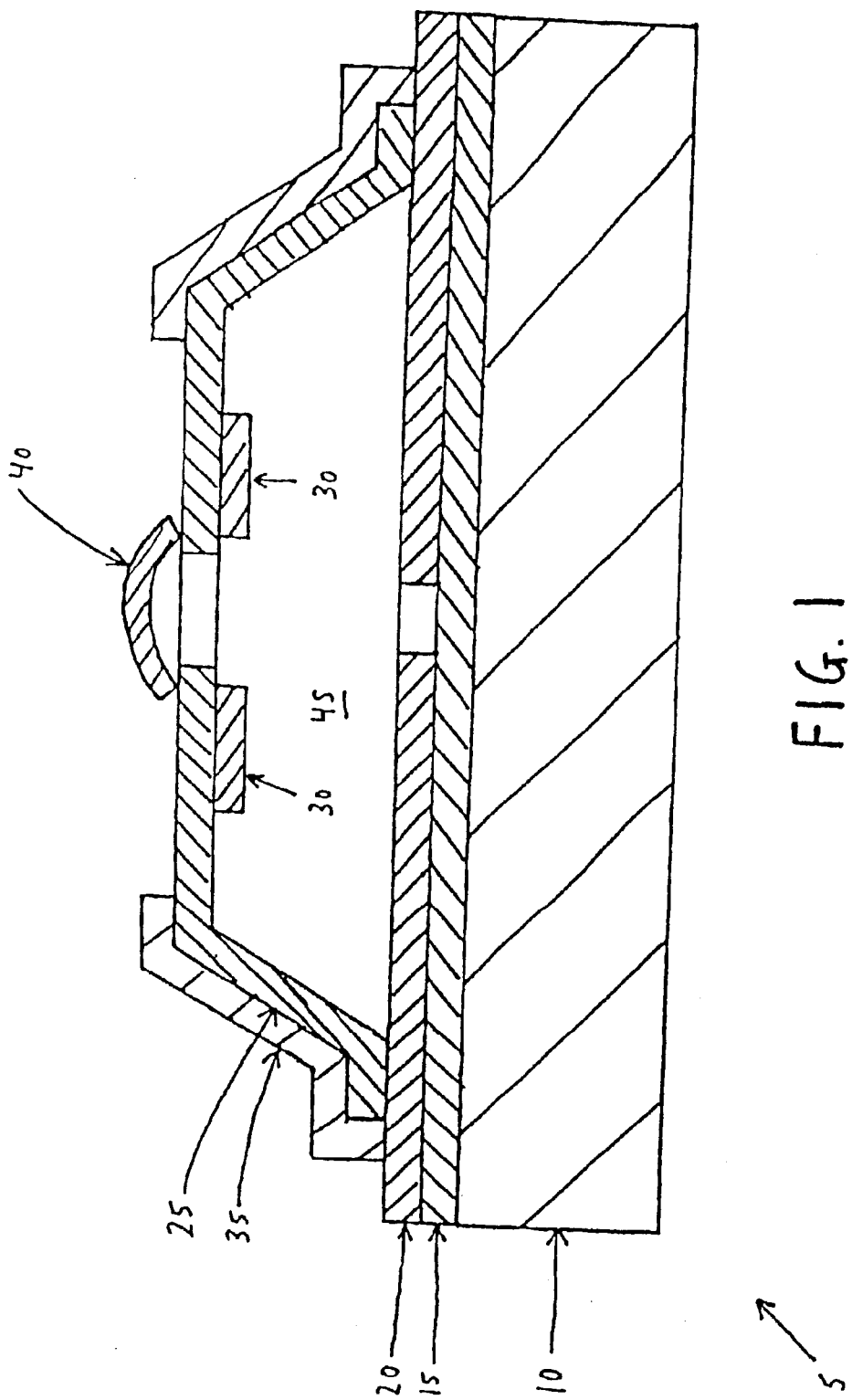
FIG. 1 is a schematic side sectional view of a tunable Fabry-Perot filter.

Looking now at FIG. 1, there is shown a tunable Fabry-Perot filter 5. Filter 5 generally comprises a substrate 10, a bottom mirror 15 mounted to the top of substrate 10, a bottom electrode 20 mounted to the top of bottom mirror 15, a thin membrane support 25 atop bottom electrode 20, a top electrode 30 fixed to the underside of thin membrane support 25, a reinforcer 35 fixed to the outside perimeter of thin membrane support 25, and a confocal top mirror 40 set atop thin membrane support 25, with an air cavity 45 being formed between bottom mirror 15 and top mirror 40.

As a result of this construction, a Fabry-Perot filter is effectively created between top mirror 40 and bottom mirror 15. Furthermore, by applying an appropriate voltage across top electrode 30 and bottom electrode 20, the position of top mirror 40 can be changed relative to bottom mirror 15, whereby to change the length of the Fabry-Perot cavity, and hence tune Fabry-Perot filter 5.

Figure 2:
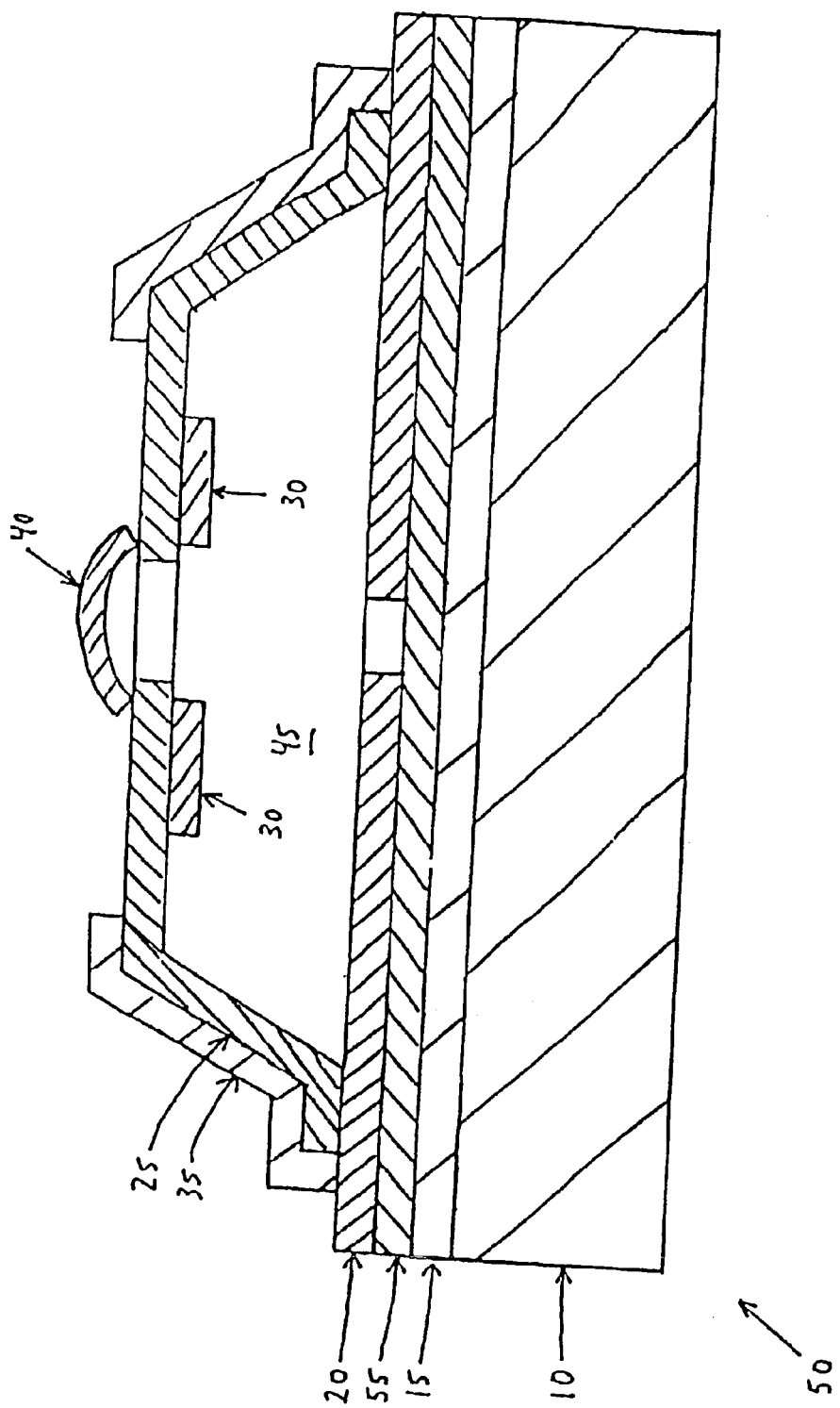
FIG. 2 is a schematic side sectional view of a tunable VCSEL.

Correspondingly, and looking next at FIG. 2, a tunable vertical cavity surface emitting laser (VCSEL) 50 can be constructed by positioning a gain region (or "active region") 55 between bottom mirror 15 and bottom electrode 20. As a result, when gain region 55 is appropriately stimulated, e.g., by optical pumping, lasing can be established between top mirror 40 and bottom mirror 15. Furthermore, by applying an appropriate voltage across top electrode 30 and bottom electrode 20, the position of top mirror 40 can be changed relative to bottom mirror 15, whereby to change the length of the laser's resonant cavity, and hence tune VCSEL 50.

As noted above, tunable Fabry-Perot filters and tunable VCSEL's of the type disclosed above are advantageous, since they can be quickly and easily tuned to a desired wavelength by simply changing the voltage applied across the top electrode and the bottom electrode.

However, it has also been found that tunable Fabry-Perot filters and tunable VCSEL's of the type disclosed above have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific wavelength. This can present an issue in some applications, particularly telecommunications applications, where the devices may need to be tuned to precise, known wavelengths (e.g., to the ITU WDM grid).

Figure 3:
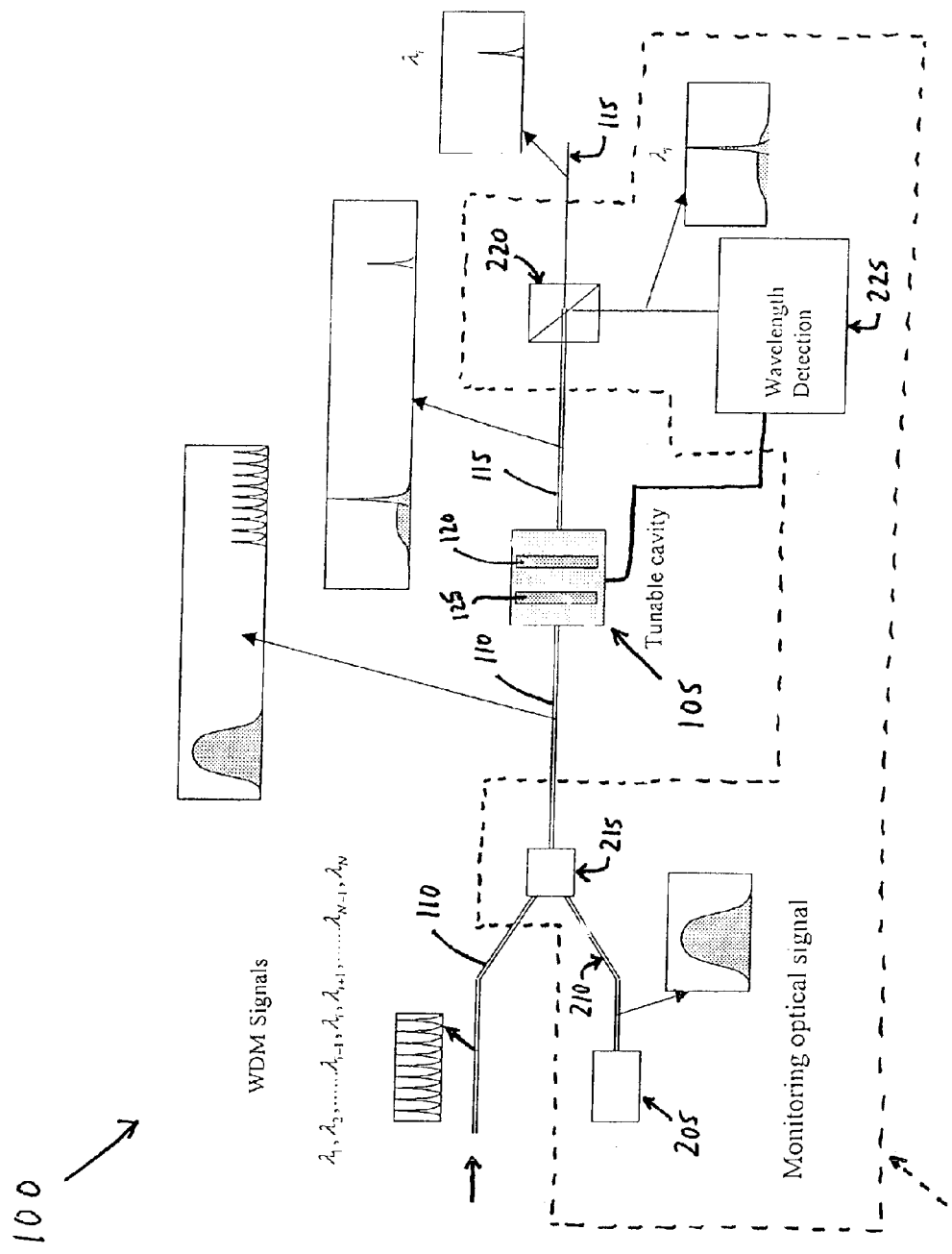
FIG. 3 is a schematic diagram of a novel optical system comprising a tunable Fabry-Perot filter or a tunable VCSEL, and further comprising novel apparatus for use in tuning the tunable Fabry-Perot filter or tunable VCSEL to a precise, known wavelength.

Looking next at FIG. 3, there is shown a novel optical system 100 which comprises a tunable Fabry-Perot filter or tunable VCSEL 105, and which further comprises a novel wavelength tracker 200 for use in tuning the tunable Fabry-Perot filter or tunable VCSEL 105 to a precise, known wavelength.

More particularly, novel optical system 100 generally comprises the tunable Fabry-Perot filter or tunable VCSEL 105, and a pair of optical fibers 110 and 115. Where tunable device 105 comprises a tunable Fabry-Perot filter, optical fiber 110 might comprise an input line and optical fiber 115 might comprise an output line, with the tunable Fabry-Perot filter serving to ensure that only light of a selected wavelength passes from the input line to the output line. Where tunable device 105 comprises a tunable VCSEL, optical fiber 110 might comprise an input line to deliver pump light from an optical pump laser to the VCSEL, and optical fiber 115 might comprise an output line for carrying off the laser light generated by the VCSEL.

The tunable device 105 is preferably a tunable Fabry-Perot filter or tunable VCSEL of the type disclosed above. It should also be appreciated, however, that the tunable device 105 may also comprise other known types of tunable filters, tunable VCSEL's and/or other tunable devices compatible with the present invention.

Novel optical system 100 also comprises the novel wavelength locker 200 for use in tuning the tunable Fabry-Perot filter or tunable VCSEL 105 to a precise, known wavelength. Wavelength locker 200 generally comprises a light source 205 for supplying a monitoring optical signal, and an optical fiber 210 for supplying that monitoring optical signal to a coupler 215, where the monitoring optical signal can be combined with light passing down optical fiber 110. Wavelength locker 200 also comprises a beam splitter 220 for tapping a small amount of the light emerging from tunable device 105, and a wavelength detector and control unit 225 for detecting the light from beam splitter 220 and for controlling the tuning voltage applied to tunable device 105, according to the wavelength of the light detected at beam splitter 220, whereby to tune tunable device 105 to a precise, known wavelength.

Light source 205 may be any light source which produces light at a wavelength which is a higher order mode of the wavelength of interest for tunable device 105. Preferably light source 205 is configured to produce light at wavelengths which are at a plurality of higher order modes of the wavelength of interest for tunable device 105. Furthermore, light source 205 is preferably configured to produce light at wavelengths which are significantly spaced (within the optical spectrum) from the wavelengths of interest for tunable device 105.

By way of example, where tunable device 105 is to operate at an "operational wavelength" of around 1550 nm, light source 205 might be configured to produce light at a "monitoring wavelength" of around 517 nm. In one preferred form of the invention, light source 205 may be a broadband light source (e.g., generating light with a wavelength of approximately 500–550 nm), such as might be provided by an LED.

Coupler 215 is a conventional optical coupler of the sort well known in the art. Coupler 215 allows the monitoring optical signal from light source 205 to be merged with light passing down input fiber 110 so that both forms of light can enter tunable device 105.

Beam splitter 220 comprises a beam splitter which is adapted to divert some of the light emerging from tunable device 105 to wavelength detector and control unit 225, while passing the remainder of the light emerging from tunable device 105 further down optical fiber 115. By way of example but not limitation, beam splitter 220 might comprise a simple power splitter adapted to divert a small amount of the light emerging from tunable device 105 to wavelength detector and control unit 225, while still passing the great majority of the light emerging from tunable device 105 further down optical fiber 115. By way of further example but not limitation, beam splitter 220 might divert 2% of the light emerging from tunable device 105 to wavelength detector and control unit 225 while passing the remaining 98% of the light emerging from tunable device 105 further down optical fiber 115.

Wavelength detector and control unit 225 comprises a wavelength detector component which is adapted to detect the wavelength of light diverted by beam splitter 220, and a control unit component which is adapted to control the tuning voltage applied to the tunable device 105 in accordance with the wavelength of the light diverted by beam splitter 220. Such wavelength detector components and control unit components are preferably of the sort known in the art, e.g., the control unit component may comprise appropriate logic and voltage controllers, etc.

Assuming, for the sake of example, that tunable device 105 comprises a tunable Fabry-Perot filter, and the system is to be used to ensure that only light of a selected wavelength passes from the input line (i.e., optical fiber 110) to the output line (i.e., optical fiber 115). Since tunable device 105 comprises a Fabry-Perot cavity, it will simultaneously support related wavelength modes, i.e., a target operational wavelength mode and higher order monitoring wavelength modes.

Inasmuch as the target operational wavelength mode and the higher order monitoring wavelength modes are always related to one another, the wavelength detector and control unit 225 can sweep the tuning voltage applied to tunable device 105 until a desired higher order monitoring wavelength is detected, whereupon the tunable device 105 will be properly tuned to the desired operational wavelength.

Thus, for example, it is desired to tune the tunable device 105 to a target wavelength of 1550 nm. Light source 205 is energized and wavelength detector and control unit 225 sweeps the tuning voltage applied to tunable device 105 until light of a higher order mode (e.g., 517 nm) is detected. At this point, the Fabry-Perot cavity of tunable device 105 will be tuned to the desired target wavelength. Thus, by using the monitoring optical signal of light source 205, the Fabry-Perot cavity of tunable device 105 can be tuned to a higher order mode of the target operational wavelength, so that the tunable device is in fact tuned to the desired operational wavelength.

In the foregoing example, tunable device 105 has been discussed in the context of being a tunable filter. However, it will also be appreciated by those skilled in the art that tunable device 105 may also comprise a tunable VCSEL or any other tunable device compatible with the present invention.

Wavelength locker 200 provides a fast, efficient and reliable way to monitor and control the operational wavelength of tunable device 105. Among other things:

(1) by providing a light source 205 which is independent of the operational light which is to be tuned, the tunable device can be kept tuned to a target wavelength even when there is no operational light present at the tunable device 105 (e.g., where there is no operational signal entering a tunable filter);

(2) by providing a light source 205 which has a wavelength which is a higher order mode of the operational wavelength, tuning the tunable device to the higher order mode of the light source 205 will always tune the tunable device to the desired operational wavelength;

(3) by configuring light source 205 so that it generates a wavelength at a higher order mode of the operational wavelength, and by significantly spacing (within the optical spectrum) the higher order mode from the operational mode, optical cross-talk between the operational signal and the monitoring signal will be minimized; and (4) inasmuch as the monitoring wavelengths and the operational wavelengths can co-exist simultaneously in the Fabry-Perot cavity, wavelength tracking can occur in real time.

As previously stated, beam splitter 220 can be a simple power splitter for diverting a small amount of light emerging from tunable device 105 to wavelength detector and control unit 225, while passing the majority of light emerging from tunable device 105 down optical fiber 105. However, if desired, beam splitter 220 may be a dichroic filter adapted to send light above a selected wavelength one way (e.g., to wavelength detector and control unit 225) and light below a selected wavelength another way (e.g., further down the output line). In such a case, beam splitter 220 would be adapted to send light at the monitoring wavelength to wavelength detector and control unit 225, and to send light at the operational wavelength further down the output line.

Figure 4:
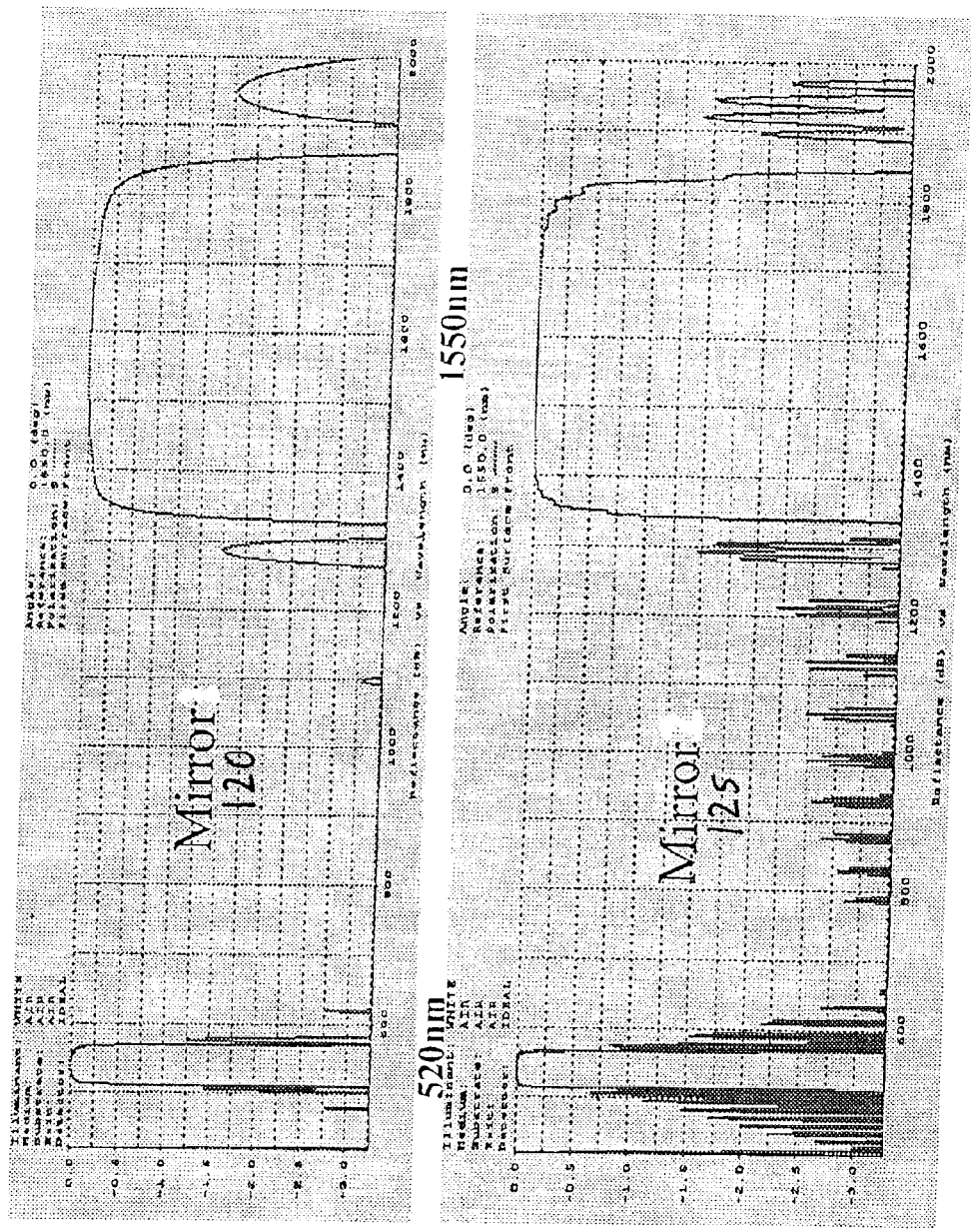
FIG. 4 is a schematic diagram of the mirror reflectivity characteristics of one embodiment of the present invention.
Figure 5:
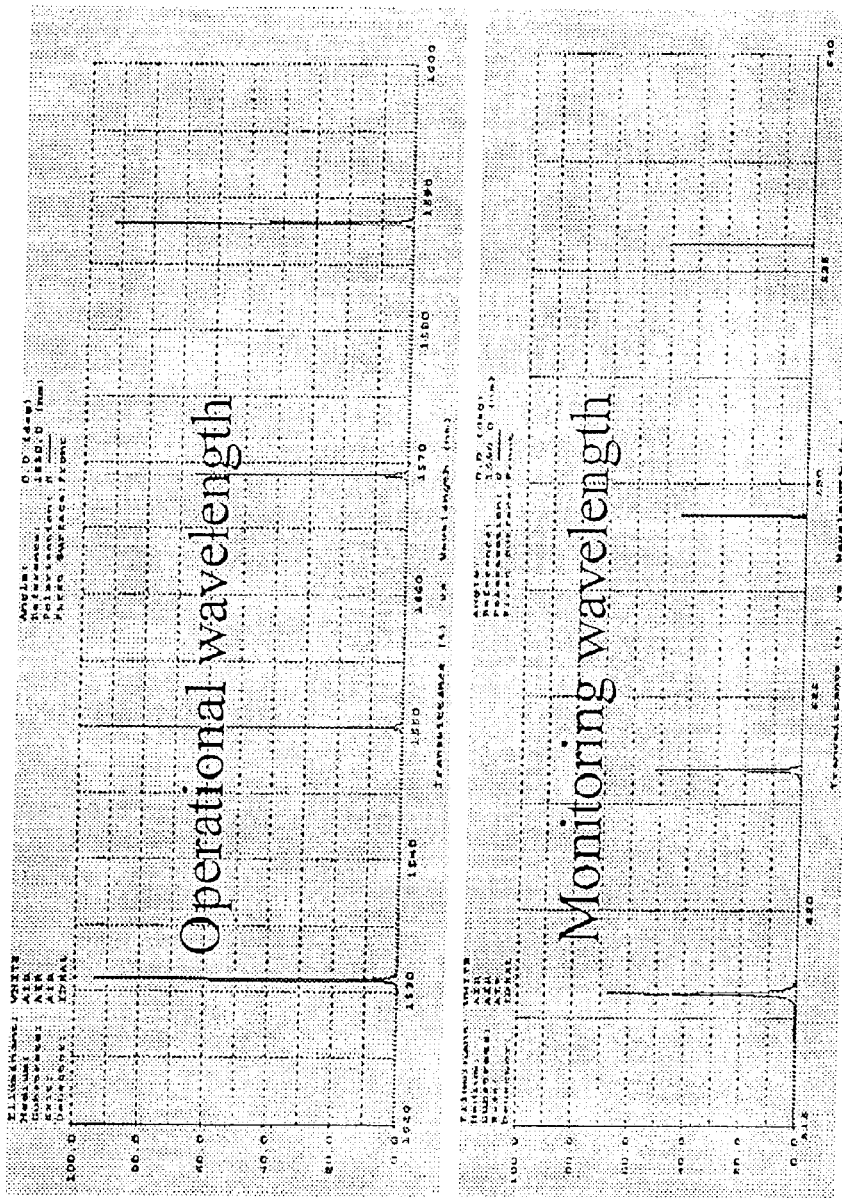
FIG. 5 is a schematic diagram of the relationship between the operational wavelength and the monitoring wavelength in one embodiment of the present invention.
Figure 6:
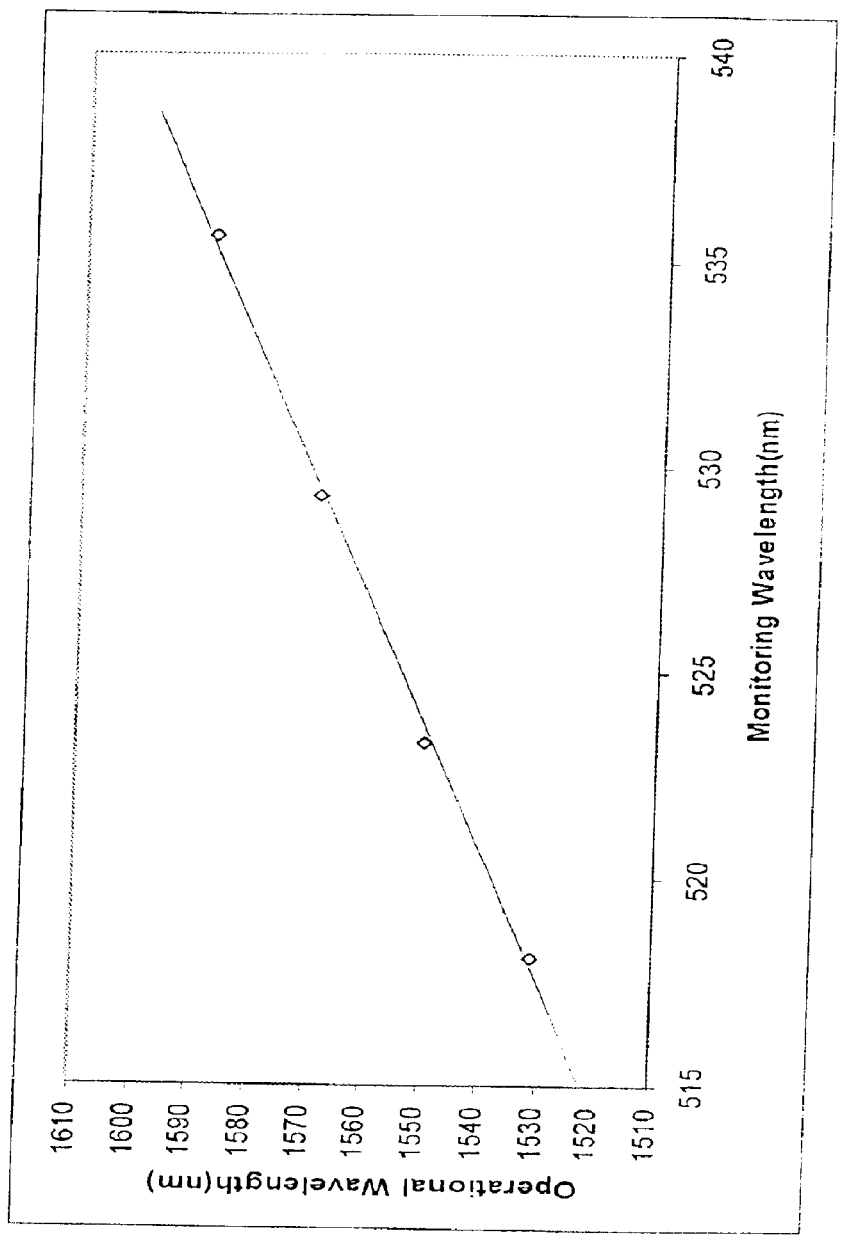
FIG. 6 is a schematic diagram of the relationship between the operational wavelength and the monitoring wavelength in one embodiment of the present invention.

Furthermore, in one preferred form of the invention, tunable device 105 comprises "top" and "bottom" mirrors 120, 125 that are formed by distributed Bragg reflector (DBR) structures. Such mirrors have different reflectivity characteristics at different wavelengths, and this feature can be used to advantageous effect in the present invention. More particularly, suppose, for example, that it is known that tunable device 105 will be tuned to an operational wavelength of 1550 nm. In this case, the Fabry-Perot cavity of the tunable device will be tuned so that the cavity has a first order resonant frequency of about 1550 nm, a second order resonant frequency of about 1035 nm, a third order resonant frequency of about 517 nm, etc. Here, the DBR mirrors 120, 125 can be engineered to have relatively high reflectivity characteristics at the first order and third order wavelengths, and to have substantially no reflectivity at the second order wavelength. This will ensure a large wavelength gap between the operational wavelength and the monitoring wavelength (i.e., first order, 1550 nm; third order, 517 nm). See, for example, FIGS. 4–6, which illustrate one such construction.

It is to be understood that the present invention is by no means limited to the particular constructions and method steps disclosed above and/or shown in the drawings, but also comprises any modifications or equivalents within the scope of the claims.

What is claimed is:

1. Apparatus for monitoring and controlling the operational wavelength of a tunable device comprising a Fabry-Perot cavity, said apparatus comprising:

a light source for generating light at a wavelength which is a higher order mode of the operational wavelength of the tunable device and directing at least a portion of the light into the tunable device; and a wavelength detector and control unit for monitoring light from the light source emerging from the tunable device and controlling the tuning voltage applied to the tunable device according to the monitored light.

2. Apparatus according to claim 1 wherein said light source is adapted to produce light at wavelengths which are at a plurality of higher order modes of the operational wavelength.

3. Apparatus according to claim 1 wherein said light source is adapted to produce light at a wavelength which is significantly spaced from the operational wavelength.

4. Apparatus according to claim 1 wherein said light source comprises a broadband light source.

5. Apparatus according to claim 4 wherein said light source comprises an LED.

6. Apparatus according to claim 5 wherein said LED generates light with a wavelength of approximately 500–550 nm.

7. Apparatus according to claim 1 wherein said apparatus further comprises a beam splitter for receiving light emerging from the unable device, and further wherein said beam splitter is adapted to direct some of the light emerging from the tunable device to said wavelength detector and control unit.

8. Apparatus according to claim 7 wherein said beam splitter comprises a power splitter.

9. Apparatus according to claim 7 wherein said beam splitter comprises a dichroic filter.

10. Apparatus according to claim 1 wherein said wavelength detector and control unit comprises a wavelength detector component.

11. Apparatus according to claim 1 wherein said wavelength detector and control unit comprises a control unit component.

12. Apparatus according to claim 11 wherein said control unit comprises logic and voltage controllers.

13. Apparatus according to claim 1 wherein said tunable device comprises a front mirror and a rear mirror, and further wherein at least one of said front mirror and said rear mirror is configured to have low reflectivity at at least one higher order mode of the operational wavelength of the tunable device.

14. Apparatus according to claim 13 wherein said at least one of said front mirror and said rear mirror comprises a distributed Bragg reflector (DBR) structure.

15. Apparatus according to claim 1 wherein the tunable device comprises a tunable Fabry-Perot filter.

16. Apparatus according to claim 1 wherein the tunable device comprises a tunable VCSEL.

17. Apparatus for providing light of a selected wavelength, said apparatus comprising
   a tunable device comprising a tunable Fabry-Perot cavity; and
   apparatus for monitoring and controlling the operational wavelength of said tunable device, said apparatus comprising:
   a light source for generating light at a wavelength which is a higher order mode of the operational wavelength of the tunable device and directing at least a portion of the light into the tunable device; and
   a wavelength detector and control unit for monitoring light from the light source emerging from the tunable device and controlling the tuning voltage applied to the tunable device according to the monitored light.

18. A method for monitoring and controlling the operational wavelength of a tunable device comprising a Fabry-Perot cavity, said method comprising:
   generating light at a wavelength which is a higher order mode of the operational wavelength of the tunable device and directing at least a portion of the light into the tunable device; and
   monitoring the wavelength of light at the higher order mode wavelength emerging from the tunable device and controlling the tuning voltage applied to the tunable device according to the monitored light.

* * * * *